(12) United States Patent
Singh

(10) Patent No.: US 10,992,271 B2
(45) Date of Patent: Apr. 27, 2021

(54) AMPLIFIER WITH INPUT BIAS CURRENT CANCELLATION

(71) Applicant: TEXAS INSTRUMENTS INCORPORATED, Dallas, TX (US)

(72) Inventor: Ravpreet Singh, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 64 days.

(21) Appl. No.: 16/411,213

(22) Filed: May 14, 2019

(65) Prior Publication Data

US 2020/0204124 A1 Jun. 25, 2020

(30) Foreign Application Priority Data

Dec. 24, 2018 (IN) .............................. 201841048833

(51) Int. Cl.
*H03F 3/45* (2006.01)
*H03G 3/30* (2006.01)
*H03F 3/21* (2006.01)

(52) U.S. Cl.
CPC ................. *H03F 3/45* (2013.01); *H03F 3/21* (2013.01); *H03G 3/3042* (2013.01)

(58) Field of Classification Search
CPC ........ H03F 3/45; H03F 3/21; H03F 2200/411; H03F 2200/261; H03F 3/45089; H03F 1/0205; H03F 3/45094; H03F 3/45183; H03F 3/45179; H03F 3/45192; H03F 3/3022; H03F 3/45071; H03F 3/45085; H03G 3/3042

USPC ......................................... 330/253, 255, 257
See application file for complete search history.

(56) References Cited

U.S. PATENT DOCUMENTS

| 3,714,600 | A | * | 1/1973 | Kuijk ...................... H03F 3/347 330/288 |
| 4,471,321 | A | * | 9/1984 | Bowers ..................... H03F 1/56 330/257 |
| 4,639,684 | A | * | 1/1987 | Laude ................ H03F 3/45479 330/257 |
| 4,843,342 | A | * | 6/1989 | Hester ...................... H03F 1/56 330/257 |
| 6,636,111 | B1 | * | 10/2003 | Gross ....................... H03F 1/56 327/307 |
| 6,965,267 | B2 | * | 11/2005 | Delorme .................. H03F 1/56 327/478 |
| 7,564,309 | B2 | * | 7/2009 | Chiu ................... H03F 3/45085 330/257 |

(Continued)

*Primary Examiner* — Khanh V Nguyen

(74) *Attorney, Agent, or Firm* — John R. Pessetto; Charles A. Brill; Frank D. Cimino

(57) ABSTRACT

An amplifier includes a first input transistor, a second input transistor, a first cascode transistor, a second cascode transistor, a first current mirror circuit, and a second current mirror circuit. The first input transistor is coupled to a first input terminal. The second input transistor is coupled to a second input terminal and the first input transistor. The first cascode transistor is coupled to the first input transistor. The second cascode transistor is coupled to the second input transistor and the first cascode transistor. The first current mirror circuit is coupled to the first cascode transistor, the second cascode transistor, and the first input terminal. The second current mirror circuit is coupled to the first cascode transistor, the second cascode transistor, and the second input terminal.

11 Claims, 4 Drawing Sheets

(56) References Cited

U.S. PATENT DOCUMENTS 8,130,037 B2 * 3/2012 Bowers ............... H03F 1/302
 330/261

* cited by examiner

AMPLIFIER WITH INPUT BIAS CURRENT CANCELLATION

CROSS-REFERENCE TO RELATED APPLICATIONS

The present application claims priority to India Provisional Patent Application No. 201841048833, filed Dec. 24, 2018, entitled "Input Bias Current Cancellation of BJT Amplifiers," which is hereby incorporated herein by reference in its entirety.

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc.

An operational amplifier may include multiple stages, where each stage is designed to perform different functions. For example, an earlier stage (in the signal path) may be designed to provide voltage/current amplification, while a later stage may be designed to provide power amplification while maintaining a high efficiency.

SUMMARY

Operational amplifiers with input bias current cancellation are disclosed herein. In one example, an amplifier includes a first input transistor, a second input transistor, a first cascode transistor, a second cascode transistor, a first current mirror circuit, and a second current mirror circuit. The first input transistor is coupled to a first input terminal. The second input transistor is coupled to a second input terminal and the first input transistor. The first cascode transistor is coupled to the first input transistor. The second cascode transistor is coupled to the second input transistor and the first cascode transistor. The first current mirror circuit is coupled to the first cascode transistor, the second cascode transistor, and the first input terminal. The second current mirror circuit is coupled to the first cascode transistor, the second cascode transistor, and the second input terminal.

In another example, an amplifier input stage includes a first input transistor, a second input transistor, a first cascode transistor, a second cascode transistor, a first current mirror circuit, and a second current mirror circuit. The first input transistor includes a first terminal that is coupled to a first signal input terminal. The second input transistor includes a first terminal that is coupled to a second signal input terminal, and a second terminal that is coupled to a second terminal of the first input transistor. The first cascode transistor includes a first terminal that is coupled to a third terminal of the first input transistor. The second cascode transistor includes a first terminal that is coupled to a third terminal of the second input transistor, and a second terminal that is coupled to a second terminal of the first cascode transistor. The first current mirror circuit is coupled to the second terminal of the first cascode transistor, the second terminal of the second cascode transistor, and the first terminal of the first input transistor. The second current mirror circuit is coupled to the second terminal of the first cascode transistor, the second terminal of the second cascode transistor, and the first terminal of the second input transistor.

In a further example, an amplifier includes a first input transistor, a second input transistor, a first cascode transistor, a second cascode transistor, a first current mirror circuit, and a second current mirror circuit. The first input transistor and the second input transistor are configured to receive a differential input signal. The first cascode transistor is coupled to the first input transistor. The second cascode transistor is coupled to the second input transistor. The first current mirror circuit is coupled to the first cascode transistor, and is configured to provide a bias cancellation current to the first input transistor. The second current mirror circuit is coupled to the second cascode transistor, and configured to provide a bias cancellation current to the second input transistor.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Amplifiers that include bipolar input transistors have an input bias current that is undesirable in some applications. To cancel the input bias current, some amplifier implementations include a replica of the amplifier input stage that generates a replica current equivalent to the input bias current. The input bias current is reduced by subtracting the replica current from the input bias current. Matching of currents between the input stage and the replica circuit must be accurate for good cancellation. Other amplifier implementations are trimmed at manufacture to reduce the input bias currents.

The amplifiers disclosed herein provide input bias current cancellation without trimming or replica circuits. The amplifiers add bipolar cascode transistors to the input transistors, and sense the base currents of the cascode transistors. Current mirror circuits mirror the base currents of the cascode transistors, and provide the mirrored currents to the input transistors for subtraction from the input bias currents. The cascode transistor base currents are the same as the base currents of the input transistors, and are without mismatch effects.

Implementations of the amplifiers also compensate for errors that decrease cancellation accuracy. Some implementations include circuitry that compensates for collector-emitter voltage ($V_{CE}$) mismatch between the input transistors and the cascode transistors. Some implementations include circuitry that compensates for the finite current gain of the NPN transistors included in the current mirror circuits.

Figure 1:
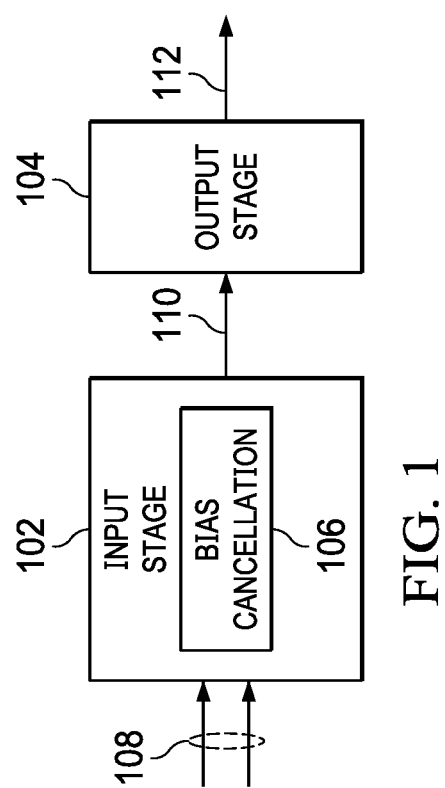
FIG. 1 shows a block diagram for an example amplifier that includes input bias current cancellation in accordance with the present disclosure.

FIG. 1 shows a block diagram for an example amplifier 100 that includes input bias current cancellation in accordance with the present disclosure. The amplifier 100 includes an input stage 102 and an output stage 104. The input stage 102 receives a differential input signal 108 and produces an output signal 110. The output stage 104 receives the output signal 110 generated by the input stage 102, and further amplifies the output signal 110 to produce amplifier output signal 112. The output stage 104 includes class-AB amplifier circuitry in some implementations.

The input stage 102 includes bipolar input transistors, and bias cancellation circuitry 106 that compensates for input bias current in the bipolar input transistors. The bias cancellation circuitry 106 adds bipolar cascode transistors to the input transistors, senses the base current of the cascode transistors, and subtracts the sensed currents from the base terminals of the input transistors. Implementations of the bias cancellation circuitry 106 provides up to a 100$x$ reduction in input bias current without requiring trim at manufacture.

Figure 2:
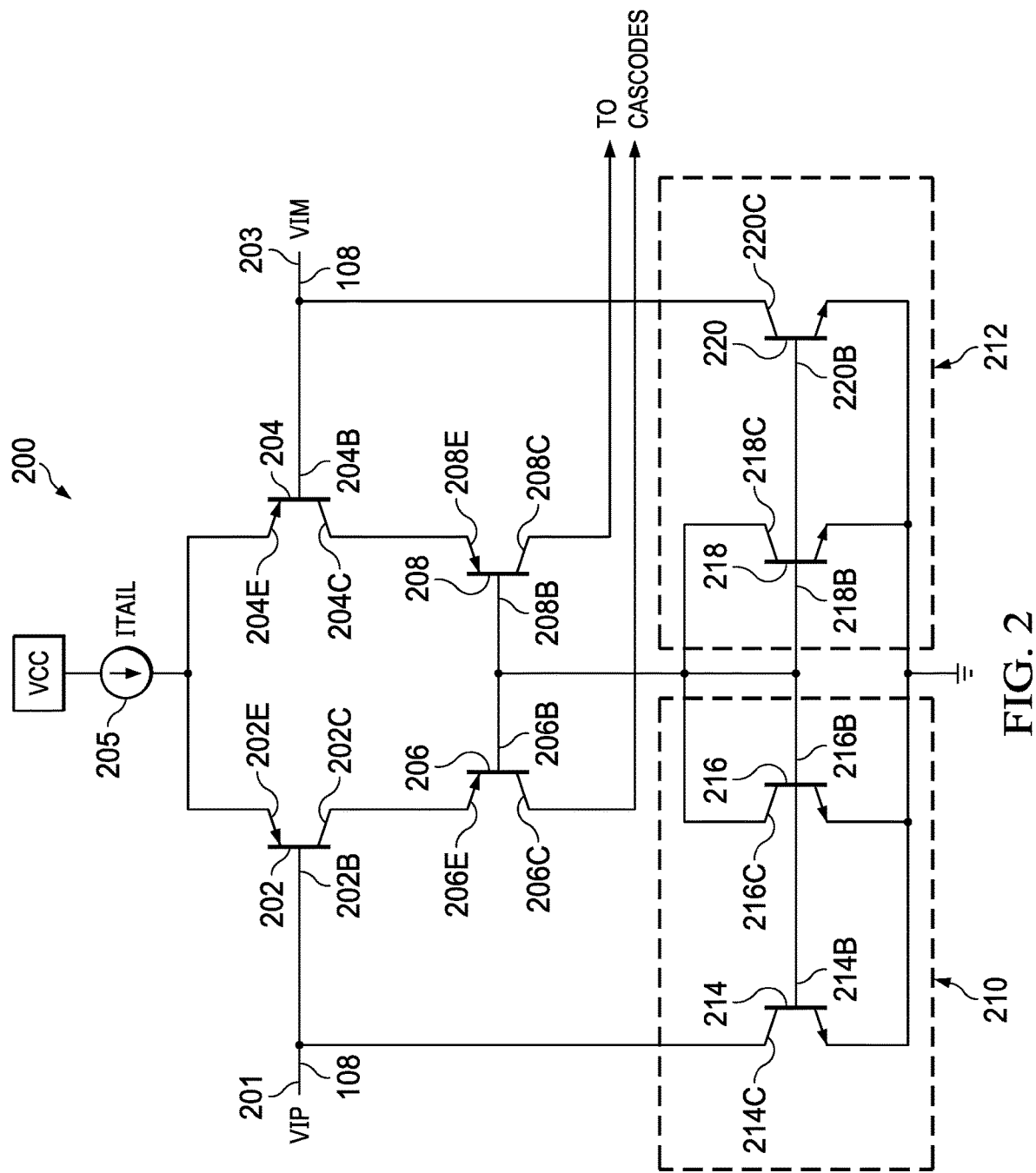
FIG. 2 shows a schematic diagram for a portion of an example amplifier input stage that includes input bias current cancellation in accordance with the present disclosure.

FIG. 2 shows a schematic diagram for a portion of an example amplifier input stage 200 that includes input bias current cancellation in accordance with the present disclosure. The input stage 200 is an implementation of the input stage 102. The input stage 200 includes an input transistor 202, an input transistor 204, a cascode transistor 206, a cascode transistor 208, a current mirror circuit 210, and a current mirror circuit 212. The input transistor 202 and the input transistor 204 are arranged to receive the differential input signal 108. The input transistor 202 includes a base terminal 202B that is coupled to an input terminal 201. The input transistor 204 includes a base terminal 204B that is coupled to an input terminal 203. An emitter terminal 202E of the input transistor 202 is coupled to an emitter terminal 204E of the input transistor 204 and a current source 205. The input transistor 202 and the input transistor 204 are bipolar PNP transistors in some implementations of the input stage 200.

The collector terminal 202C of the input transistor 202 is coupled to the emitter terminal 206E of the cascode transistor 206, and the collector terminal 204C of the input transistor 204 is coupled to the emitter terminal 208E of the cascode transistor 208. The base terminal 206B of the cascode transistor 206 is coupled to the base terminal 208B of the cascode transistor 208. The collector terminal 206C of the cascode transistor 206 and the collector terminal 208C of the cascode transistor 208 are coupled to additional cascode transistors that are not shown in FIG. 2. As shown in FIG. 2, the cascode transistor 206 and the cascode transistor 208 are bipolar PNP transistors in some implementations of the input stage 200.

The current mirror circuit 210 includes transistor 214 and transistor 216. The transistor 214 and the transistor 216 are bipolar NPN transistors in some implementations of the input stage 200. The transistor 216 is diode-connected with the base terminal 216B coupled to the collector terminal 216C. The base terminal 216B of the transistor 216 is coupled to the base terminal 206B of the cascode transistor 206 and the base terminal 208B of the cascode transistor 208 for sensing of the base currents of the cascode transistor 206 and the cascode transistor 208. The base terminal 214B of the transistor 214 is coupled to the base terminal 216B of the transistor 216. The collector terminal 214C of the transistor 214 is coupled to the base terminal 202B of the input transistor 202 and the input terminal 201 to provide the mirrored base current of the cascode transistor 206 and the cascode transistor 208 for addition to (and cancellation of) the input bias current of the input transistor 202.

The current mirror circuit 212 includes transistor 218 and transistor 220. The transistor 218 and the transistor 220 are bipolar NPN transistors in some implementations of the input stage 200. The transistor 218 is diode-connected with the base terminal 218B coupled to the collector terminal 218C. The base terminal 218B of the transistor 218 is coupled to the base terminal 206B of the cascode transistor 206 and the base terminal 208B of the cascode transistor 208 for sensing of the base currents of the cascode transistor 206 and the cascode transistor 208. The base terminal 220B of the transistor 220 is coupled to the base terminal 218B of the transistor 218. The collector terminal 220C of the transistor 220 is coupled to the base terminal 204B of the input transistor 204 and the input terminal 203 to provide the mirrored base current of the cascode transistor 206 and the cascode transistor 208 for addition to (and cancellation of) the input bias current of the input transistor 204.

Figure 3:
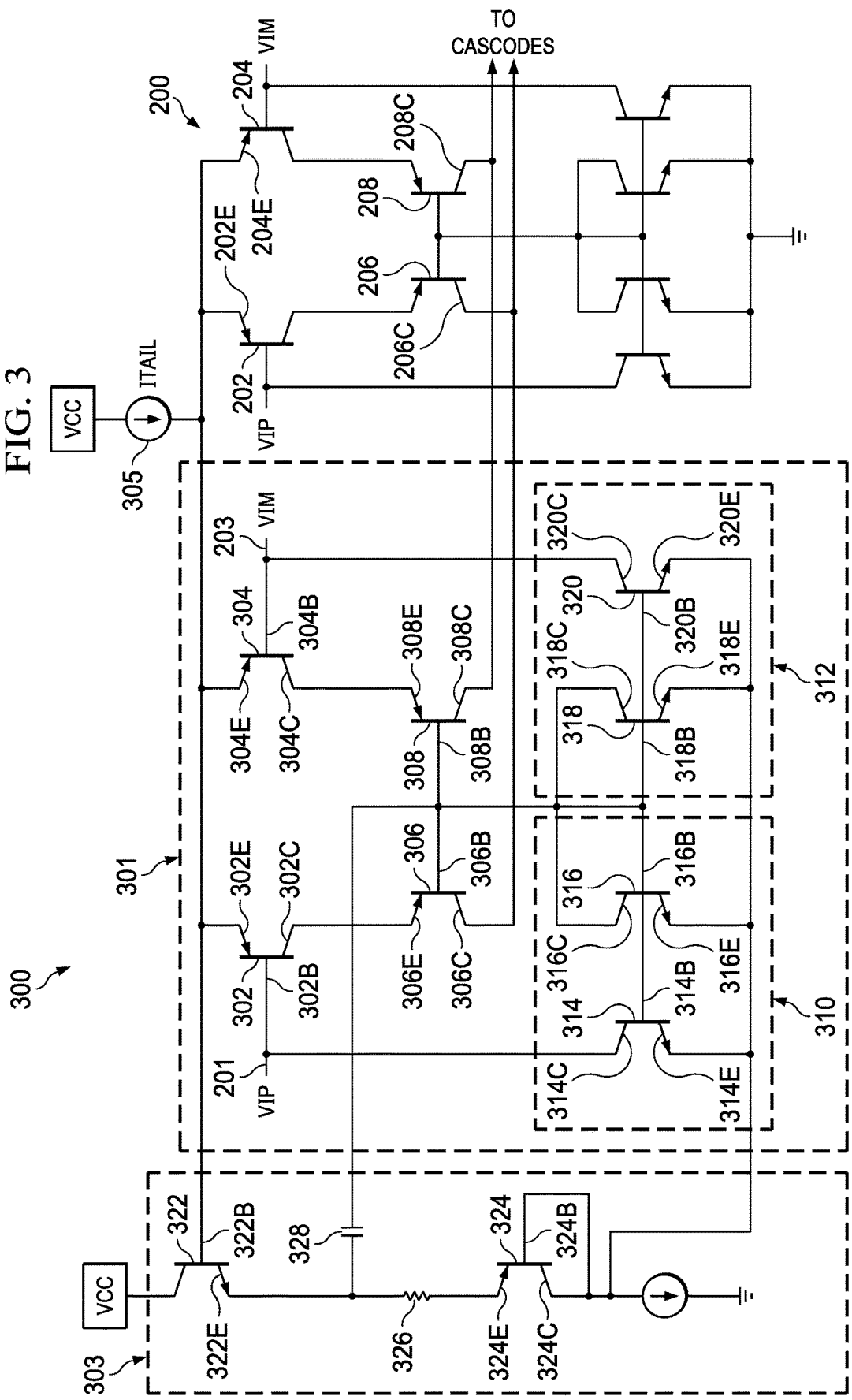
FIG. 3 shows a schematic diagram for a portion of an example amplifier input stage that includes input bias current cancellation and matching of collector-emitter voltage of the input and cascode transistors in accordance with the present disclosure.

FIG. 3 shows a schematic diagram for a portion of an example amplifier input stage 300 that includes input bias current cancellation and matching of $V_{CE}$ of the input and cascode transistors in accordance with the present disclosure. The input stage 300 includes the input stage 200 and input stage circuitry 301, which is similar to the input stage 200, and a bias circuit 303. One of the input stage 200 or the input stage circuitry 301 fixes $V_{CE}$ for the input transistors while $V_{CE}$ for the cascode transistors is dependent on the input signal, and the other of the input stage 200 or the input stage circuitry 301 fixes $V_{CE}$ for the cascode transistors while $V_{CE}$ for the input transistors is dependent on the input signal. Given this arrangement, the cascode transistors and the input transistors track $V_{CE}$ on average, and signal dependency is eliminated from the input bias current cancellation.

The input stage circuitry 301 includes an input transistor 302, an input transistor 304, a cascode transistor 306, a cascode transistor 308, a current mirror circuit 310, and a current mirror circuit 312. The input transistor 302 and the input transistor 304 are arranged to receive the differential input signal 108. The input transistor 302 includes a base terminal 302B that is coupled to an input terminal 201. The input transistor 304 includes a base terminal 304B that is coupled to the input terminal 203. An emitter terminal 302E of the input transistor 302 is coupled to an emitter terminal 304E of the input transistor 304 and to a current generator 305. The input transistor 302 and the input transistor 304 are bipolar PNP transistors in some implementations of the input stage circuitry 301.

The collector terminal 302C of the input transistor 302 is coupled to the emitter terminal 306E of the cascode transistor 306, and the collector terminal 304C of the input transistor 304 is coupled to the emitter terminal 308E of the cascode transistor 308. The base terminal 306B of the cascode transistor 306 is coupled to the base terminal 308B of the cascode transistor 308. The collector terminal 306C of the cascode transistor 306 is coupled to the collector terminal 206C of the cascode transistor 206, and the collector terminal 308C of the cascode transistor 308 is coupled to the collector terminal 208C of the cascode transistor 208. As shown in FIG. 3, the cascode transistor 306 and the cascode transistor 308 are bipolar PNP transistors in some implementations of the input stage circuitry 301.

The current mirror circuit 310 includes transistor 314 and transistor 316. The transistor 314 and the transistor 316 are bipolar NPN transistors in some implementations of the input stage circuitry 301. The transistor 316 is diode-connected with the base terminal 316B coupled to the collector terminal 316C. The base terminal 316B of the transistor 316 is coupled to the base terminal 306B of the cascode transistor 306 and the base terminal 308B of the transistor cascode 308 for sensing of the base currents of the cascode transistor 306 and the cascode transistor 308. The base terminal 314B of the transistor 314 is coupled to the base terminal 316B of the transistor 316. The collector terminal 314C of the transistor 314 is coupled to the base terminal 302B of the input transistor 302 to provide the mirrored base current of the cascode transistor 306 and the cascode transistor 208 (bias cancellation current) for addition to the input bias current of the input transistor 302.

The current mirror circuit 312 includes transistor 318 and transistor 320. The transistor 318 and the transistor 320 are bipolar NPN transistors in some implementations of the input stage circuitry 301. The transistor 318 is diode-connected with the base terminal 318B coupled to the collector terminal 318C. The base terminal 318B of the transistor 318 is coupled to the base terminal 306B of the cascode transistor 306 and the base terminal 308B of the cascode transistor 308 for sensing of the base currents of the cascode transistor 306 and the cascode transistor 308. The base terminal 320B of the transistor 320 is coupled to the base terminal 318B of the transistor 318. The collector terminal 320C of the transistor 320 is coupled to the base terminal 304B of the input transistor 304 and the input terminal 203 to provide the mirrored base current of the cascode transistor 306 and the cascode transistor 308 (bias cancellation current) for addition to the input bias current of the input transistor 304.

The bias circuit 303 is coupled to the input stage circuitry 301. The bias circuit 303 includes a transistor 322, a transistor 324, a resistor 326, and a capacitor 328. The transistor 322 is an NPN bipolar transistor and the transistor 324 is a PNP bipolar transistor in some implementations of the bias circuit 303. A base terminal 322B of the transistor 322 is coupled to the current source 305, and to an emitter terminal of each of the input transistors 202, 204, 302, and 304. An emitter terminal 322E of the transistor 322 is coupled to an emitter terminal 324E of the transistor 324 via the resistor 326. The transistor 324 is diode-connected with the base terminal 324B coupled to the collector terminal 324C. The collector terminal 324C is coupled to the emitter terminals of the transistor 314, the transistor 316, the transistor 318, and the transistor 320. The base terminals of the cascode transistor 306 and the cascode transistor 308 are coupled to the emitter terminal 322E of the transistor 322 via the capacitor 328.

In one example of the input stage 300, the input transistor 202, the input transistor 204, the cascode transistor 306, and the cascode transistor 308 have fixed $V_{CE}$, while the input transistor 302, the input transistor 304, the cascode transistor 206, and the cascode transistor 208 have $V_{CE}$ that is input signal dependent. In another example of the input stage 300, the input transistor 302, the input transistor 304, the cascode transistor 206, and the cascode transistor 208 have fixed $V_{CE}$, while the input transistor 202, the input transistor 204, the cascode transistor 306, and the cascode transistor 308 have $V_{CE}$ that is input signal dependent.

Figure 4:
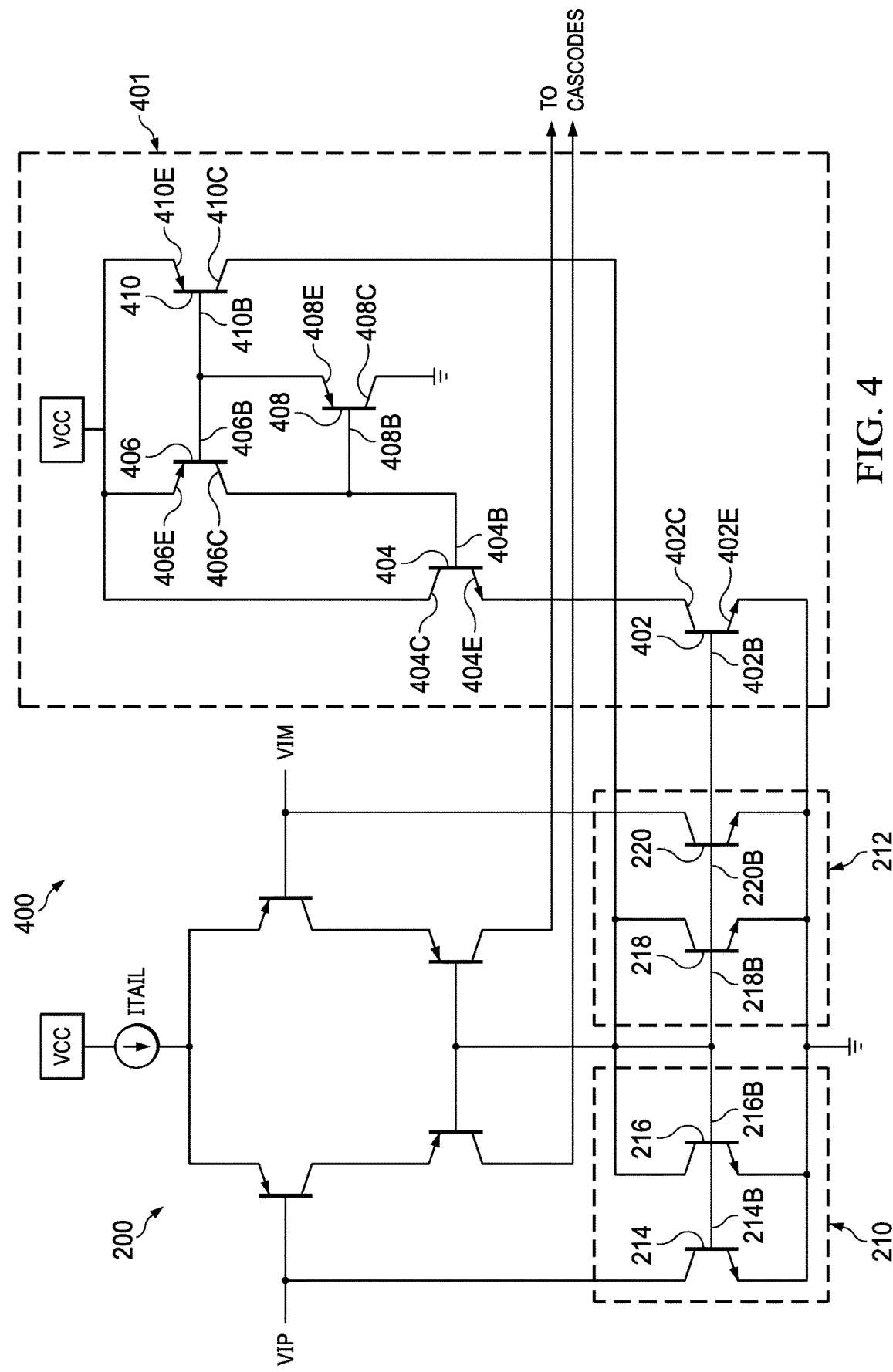
FIG. 4 shows a schematic diagram for a portion of an example amplifier input stage that includes input bias current cancellation, and cancellation of base current in the current mirrors in accordance with the present disclosure.

FIG. 4 shows a schematic diagram for a portion of an example amplifier input stage 400 that includes input bias current cancellation, and cancellation of base current in the current mirrors in accordance with the present disclosure. The amplifier input stage 400 includes the input stage 200 and a current mirror adjust circuit 401 coupled to the current mirror circuit 210 and the current mirror circuit 212. The current mirror adjust circuit 401 compensates for the finite current gain of the transistor 214, the transistor 216, the transistor 218, and the transistor 220. The current mirror adjust circuit 401 senses the base current of the transistor 214, the transistor 216, the transistor 218, and the transistor 220, and provides a compensation current to the current mirror circuit 210 and the current mirror circuit 212 to cancel the sensed current. The compensation current is equal in magnitude and opposite in polarity to the sensed current.

The current mirror adjust circuit 401 includes a sense transistor 402, a transistor 404, a transistor 406, a transistor 408, and a transistor 410. The sense transistor 402 and transistor 404 are NPN bipolar transistors, and the transistor 406, the transistor 408, and the transistor 410 are PNP bipolar transistors in some implementations of the current mirror adjust circuit 401. The base terminal 402B of the sense transistor 402 is coupled to the base terminal 214B of the transistor 214, the base terminal 216B of the transistor 216, the base terminal 218B of the transistor 218, and the base terminal 220B of the transistor 220. The collector terminal 402C of the sense transistor 402 is coupled to the emitter terminal 404E of the transistor 404.

The collector terminal 404C of the transistor 404 is coupled to the emitter terminal 406E of the transistor 406 and the emitter terminal 408E of the transistor 408. The base terminal 404B of the transistor 404 is coupled to the base terminal 408B of the transistor 408 and the collector terminal 406C of the transistor 406. The base terminal 406B of the transistor 406 is coupled to the base terminal 410B of the transistor 410 and the emitter terminal 408E of the transistor 408. The emitter terminal 410E of the transistor 410 is coupled to the emitter terminal 406E of the transistor 406 and the collector terminal 404C of the transistor 404. The collector terminal 410C of the transistor 410 (the transistor 410 is a current source) is coupled to the base terminal 216B of the transistor 216 and the base terminal 2186 of the transistor 218.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplifier, comprising:
   a first input transistor coupled to a first input terminal;
   a second input transistor coupled to a second input terminal and the first input transistor;
   a first cascode transistor coupled to the first input transistor;
   a second cascode transistor coupled to the second input transistor and the first cascode transistor;

a first current mirror circuit coupled to the first cascode transistor, the second cascode transistor, and the first input terminal;
a second current mirror circuit coupled to the first cascode transistor, the second cascode transistor, and the second input terminal;
a third input transistor coupled to a first input terminal;
a fourth input transistor coupled to a second input terminal and the third input transistor;
a third cascode transistor coupled to the third input transistor and the first cascode transistor;
a fourth cascode transistor coupled to the fourth input transistor, the second cascode transistor, and the third cascode transistor;
a third current mirror circuit coupled to the third cascode transistor, the fourth cascode transistor, and the first input terminal; and
a fourth current mirror circuit coupled to the third cascode transistor, the fourth cascode transistor, and the second input terminal.

2. The amplifier of claim 1, wherein:
voltage across the first input transistor, the second input transistor, the third cascode transistor, and the fourth cascode transistor is fixed; and voltage across the third input transistor, the fourth input transistor, the first cascode transistor, and the second cascode transistor is dependent on input signal; or
voltage across the first input transistor, the second input transistor, the third cascode transistor, and the fourth cascode transistor is dependent on input signal; and the voltage across the third input transistor, the fourth input transistor, the first cascode transistor, and the second cascode transistor is fixed.

3. The amplifier of claim 1, wherein:
the third current mirror circuit comprises:
  a first transistor, connected as a diode, and coupled to the third cascode transistor and the fourth cascode transistor; and
  a second transistor coupled to the first transistor of the third current mirror circuit and the first input terminal; and
the fourth current mirror circuit comprises:
  a first transistor, connected as a diode, and coupled to the third cascode transistor and the fourth cascode transistor; and
  a second transistor coupled to the first transistor of the fourth current mirror circuit and the second input terminal.

4. The amplifier of claim 3, further comprising a bias circuit, comprising:
a first transistor coupled to the first input transistor, the second input transistor, the third input transistor, and the fourth input transistor; and
a second transistor, connected as a diode, coupled to the first transistor of the bias circuit, the third current mirror circuit and the fourth current mirror circuit.

5. An amplifier input stage, comprising:
a first input transistor, comprising a first terminal coupled to a first signal input terminal;
a second input transistor, comprising:
  a first terminal coupled to a second signal input terminal; and
  a second terminal coupled to a second terminal of the first input transistor;
a first cascode transistor comprising a first terminal coupled to a third terminal of the first input transistor;
a second cascode transistor comprising:
  a first terminal coupled to a third terminal of the second input transistor; and
  a second terminal coupled to a second terminal of the first cascode transistor;
a first current mirror circuit coupled to the second terminal of the first cascode transistor, the second terminal of the second cascode transistor, and the first terminal of the first input transistor;
a second current mirror circuit coupled to the second terminal of the first cascode transistor, the second terminal of the second cascode transistor, and the first terminal of the second input transistor;
wherein the second current mirror circuit comprises:
a first transistor comprising:
  a first terminal coupled to the second terminal of the first cascode transistor and the second terminal of the second cascode transistor; and
  a second terminal coupled to the first terminal of the first transistor of the second current mirror circuit; and
a second transistor comprising:
  a first terminal coupled to the first terminal of the first transistor of the second current mirror circuit; and
  a second terminal coupled to the first terminal of the second input transistor;
further comprising a current mirror adjust circuit comprising:
a first transistor comprising a first terminal coupled to the first terminal of the first transistor of the second current mirror circuit;
a second transistor comprising a first terminal coupled to a second terminal of the first transistor of the current mirror adjust circuit;
a third transistor comprising a first terminal coupled to a second terminal of the second transistor of the current mirror adjust circuit;
a fourth transistor comprising:
  a first terminal coupled to the second terminal of the second transistor of the current mirror adjust circuit;
  a second terminal coupled to a second terminal of the third transistor of the current mirror adjust circuit; and
  a third terminal coupled to the first terminal of the first transistor of the second current mirror circuit; and
a fifth transistor comprising:
  a first terminal coupled to the second terminal of the fourth transistor of the current mirror adjust circuit; and
  a second terminal coupled to a third terminal of the second transistor of the current mirror adjust circuit and a third terminal of the third transistor of the current mirror adjust circuit.

6. An amplifier input stage, comprising:
a first input transistor, comprising a first terminal coupled to a first signal input terminal;
a second input transistor, comprising:
  a first terminal coupled to a second signal input terminal; and
  a second terminal coupled to a second terminal of the first input transistor;
a first cascode transistor comprising a first terminal coupled to a third terminal of the first input transistor;
a second cascode transistor comprising:
  a first terminal coupled to a third terminal of the second input transistor; and
  a second terminal coupled to a second terminal of the first cascode transistor;

a first current mirror circuit coupled to the second terminal of the first cascode transistor, the second terminal of the second cascode transistor, and the first terminal of the first input transistor;
a second current mirror circuit coupled to the second terminal of the first cascode transistor, the second terminal of the second cascode transistor, and the first terminal of the second input transistor;
a third input transistor, comprising a first terminal coupled to the first signal input terminal;
a fourth input transistor, comprising:
  a first terminal coupled to the second signal input terminal; and
  a second terminal coupled to a second terminal of the third input transistor;
a third cascode transistor comprising:
  a first terminal coupled to a third terminal of the third input transistor; and
  a second terminal coupled to a third terminal of the first cascode transistor;
a fourth cascode transistor comprising:
  a first terminal coupled to a third terminal of the fourth input transistor;
  a second terminal coupled to a third terminal of the second cascode transistor; and
  a third terminal coupled to a third terminal of the third cascode transistor;
a third current mirror circuit coupled to the second terminal of the third cascode transistor, the second terminal of the fourth cascode transistor, and the first terminal of the third input transistor; and
a second current mirror circuit coupled to the second terminal of the third cascode transistor, the second terminal of the fourth cascode transistor, and the first terminal of the fourth input transistor.

7. The amplifier input stage of claim 6, wherein:
the third current mirror circuit comprises:
  a first transistor comprising:
    a first terminal coupled to the third terminal of the third cascode transistor and the third terminal of the fourth cascode transistor; and
    a second terminal coupled to the first terminal of the first transistor of the third current mirror circuit; and
  a second transistor comprising:
    a first terminal coupled to the first terminal of the first transistor of the third current mirror circuit; and
    a second terminal coupled to the first terminal of the third input transistor; and
the fourth current mirror circuit comprises:
  a first transistor comprising:
    a first terminal coupled to the third terminal of the third cascode transistor and the third terminal of the fourth cascode transistor; and
    a second terminal coupled to the first terminal of the first transistor of the fourth current mirror circuit; and
  a second transistor comprising:
    a first terminal coupled to the first terminal of the first transistor of the fourth current mirror circuit; and
    a second terminal coupled to the first terminal of the fourth input transistor.

8. The amplifier input stage of claim 6, further comprising a bias circuit, comprising:
  a first transistor comprising a first terminal coupled to a third terminal of the first input transistor, a third terminal of the second input transistor, a third terminal of the third input transistor, and a third terminal of the fourth input transistor; and
  a second transistor comprising:
    a first terminal coupled to a second terminal of the first transistor of the bias circuit, the first current mirror circuit and the second current mirror circuit; and
    a second terminal coupled to a third terminal of the second transistor of the bias circuit, the first current mirror circuit, and the second current mirror circuit.

9. An amplifier, comprising:
  a first input transistor and a second input transistor configured to receive a differential input signal;
  a first cascode transistor coupled to the first input transistor;
  a second cascode transistor coupled to the second input transistor;
  a first current mirror circuit coupled to the first cascode transistor, and configured to provide a bias cancellation current to the first input transistor; and
  a second current mirror circuit coupled to the second cascode transistor, and configured to provide a bias cancellation current to the second input transistor;
  a third input transistor and a fourth input transistor configured to receive the differential input signal;
  a third cascode transistor coupled to the third input transistor and the first cascode transistor;
  a fourth cascode transistor coupled to the fourth input transistor and the second cascode transistor;
  a third current mirror circuit coupled to the third cascode transistor, and configured to provide a bias cancellation current to the third input transistor; and
  a fourth current mirror circuit coupled to the fourth cascode transistor, and configured to provide a bias cancellation current to the fourth input transistor.

10. The amplifier of claim 9, wherein:
voltage across the first input transistor, the second input transistor, the third cascode transistor, and the fourth cascode transistor is fixed; and the voltage across the third input transistor, the fourth input transistor, the first cascode transistor, and the second cascode transistor is dependent on input signal; or
the voltage across the first input transistor, the second input transistor, the third cascode transistor, and the fourth cascode transistor is dependent on input signal; and the voltage across the third input transistor, the fourth input transistor, the first cascode transistor, and the second cascode transistor is fixed.

11. The amplifier of claim 9, further comprising a bias circuit coupled to the third current mirror circuit, the fourth current mirror circuit, the first input transistor, the second input transistor, the third input transistor, and the fourth input transistor.

* * * * *